United States Patent
Gelsomino

(10) Patent No.: US 11,963,316 B2
(45) Date of Patent: Apr. 16, 2024

(54) LOCK-IN FEATURES FOR ELECTRONICS BOXES

(71) Applicant: CRESTRON ELECTRONICS, INC., Rockleigh, NJ (US)

(72) Inventor: Connie Gelsomino, Mamaroneck, NY (US)

(73) Assignee: CRESTRON ELECTRONICS, INC., Rockleigh, NJ (US)

( * ) Notice: Subject to any disclaimer, the term of this patent is extended or adjusted under 35 U.S.C. 154(b) by 0 days.

(21) Appl. No.: 18/215,242

(22) Filed: Jun. 28, 2023

(65) Prior Publication Data

US 2023/0389198 A1 Nov. 30, 2023

Related U.S. Application Data

(63) Continuation of application No. 17/824,301, filed on May 25, 2022, now Pat. No. 11,751,344.

(51) Int. Cl.
*H05K 5/02* (2006.01)
*H02G 3/08* (2006.01)

(52) U.S. Cl.
CPC ..................... *H05K 5/02* (2013.01)

(58) Field of Classification Search
CPC .......... H02G 3/086; H02G 3/081; H05K 5/02; H05K 5/0217
See application file for complete search history.

(56) References Cited

U.S. PATENT DOCUMENTS

| | | | | |
|---|---|---|---|---|
| 1,483,453 | A | * | 2/1924 | Knoderer ............... H02G 3/086 220/3.94 |
| 1,534,723 | A | | 8/1924 | Lewis |
| 1,672,263 | A | * | 6/1928 | Kruse .................... H02G 3/086 220/DIG. 25 |
| 3,896,960 | A | | 7/1975 | Schindler et al. |
| 4,176,759 | A | * | 12/1979 | Nattel .................... H02G 3/126 220/3.94 |
| 5,682,017 | A | | 10/1997 | Marrotte |
| 5,853,098 | A | | 12/1998 | Elder |
| 7,129,412 | B2 | | 10/2006 | Pierce |
| 7,825,336 | B2 | | 11/2010 | Peck |

(Continued)

OTHER PUBLICATIONS

"CLW-DIMB-S Wall Box Dimmer, 3 Button, Black, Smooth", (c)2022, Crestron Electronics, Inc., www.crestron.com.

(Continued)

*Primary Examiner* — Hoa C Nguyen
*Assistant Examiner* — Amol H Patel
(74) *Attorney, Agent, or Firm* — Crestron Electronics, Inc.

(57) ABSTRACT

An electronics box for insertion into a wall box includes a housing having walls that define an inner volume. One wall includes an edge having part disposed along an outer surface of that wall, and a tab disposed within the inner volume at a distance from the outer surface of the wall and extending along a direction parallel to the outer surface of the wall. Another wall includes an edge having a part along an outer surface of that wall, and an opening completely surrounded by the wall at a distance from the edge of the wall. Upon the parts of the edges of the walls being brought in contact, the tab is inserted into the opening. The tab and the opening are dimensioned such that the tab securely fits into the opening and secures together the walls.

15 Claims, 14 Drawing Sheets

(56) References Cited

U.S. PATENT DOCUMENTS

| | | |
|---|---|---|
| 8,079,561 B2 | 12/2011 | Jafari |
| 2005/0194172 A1 | 9/2005 | Ungerman et al. |
| 2014/0295073 A1 | 9/2014 | Kim et al. |

OTHER PUBLICATIONS

"CLW-SW1W-S Wall Box Switch, Single Button, White, Smooth", (c)2022, Crestron Electronics, Inc., www.crestron.com.
"CLW-DIM, CLW-DIMS, CLW-SLVD (W/A/B), Installation Guide—DOC. 5995D Stand Alone Wall Box Dimmer", Crestron Electronics, Inc., www.crestron.com.

* cited by examiner

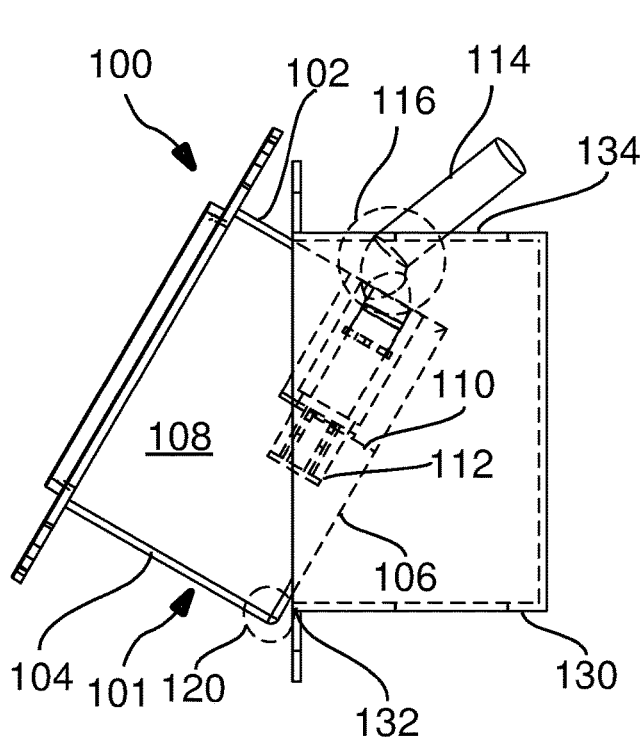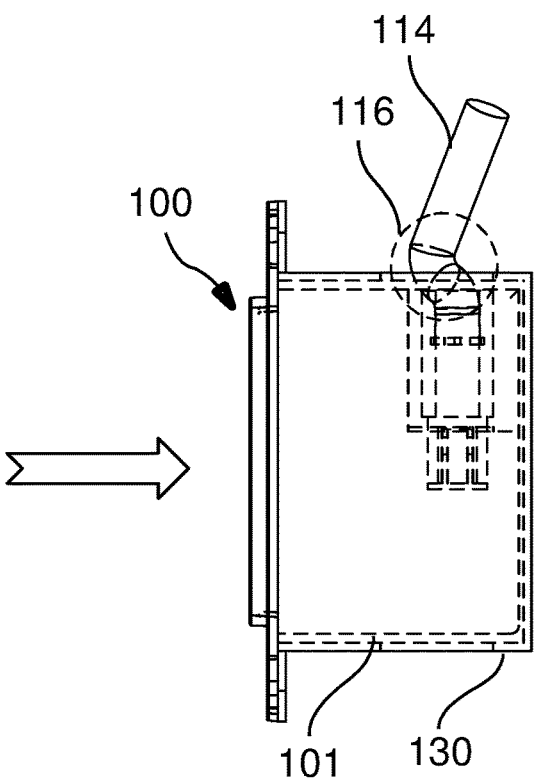
FIG. 1A
PRIOR ART
FIG. 1B
PRIOR ART
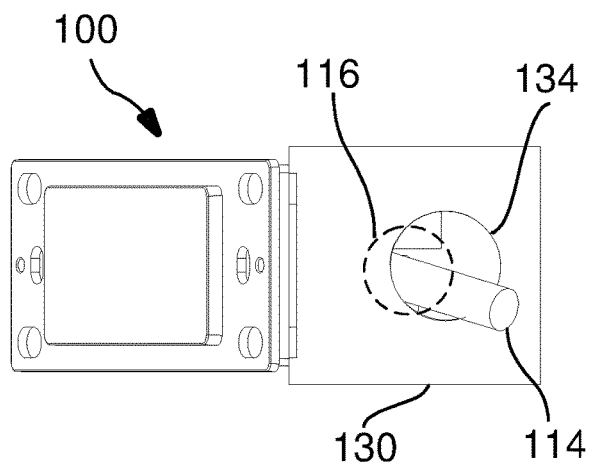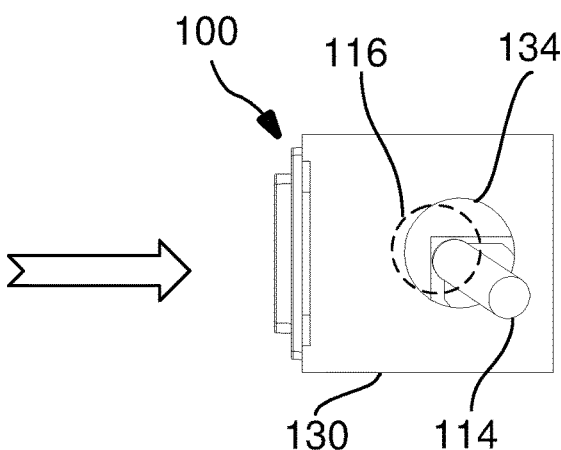
FIG. 1C
PRIOR ART
FIG. 1D
PRIOR ART

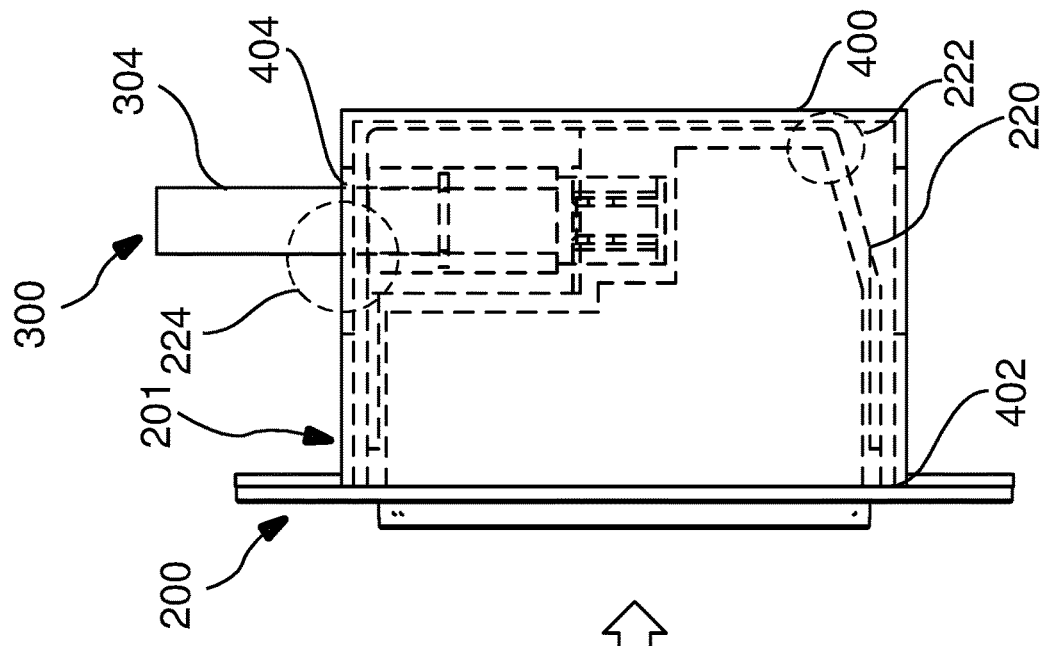
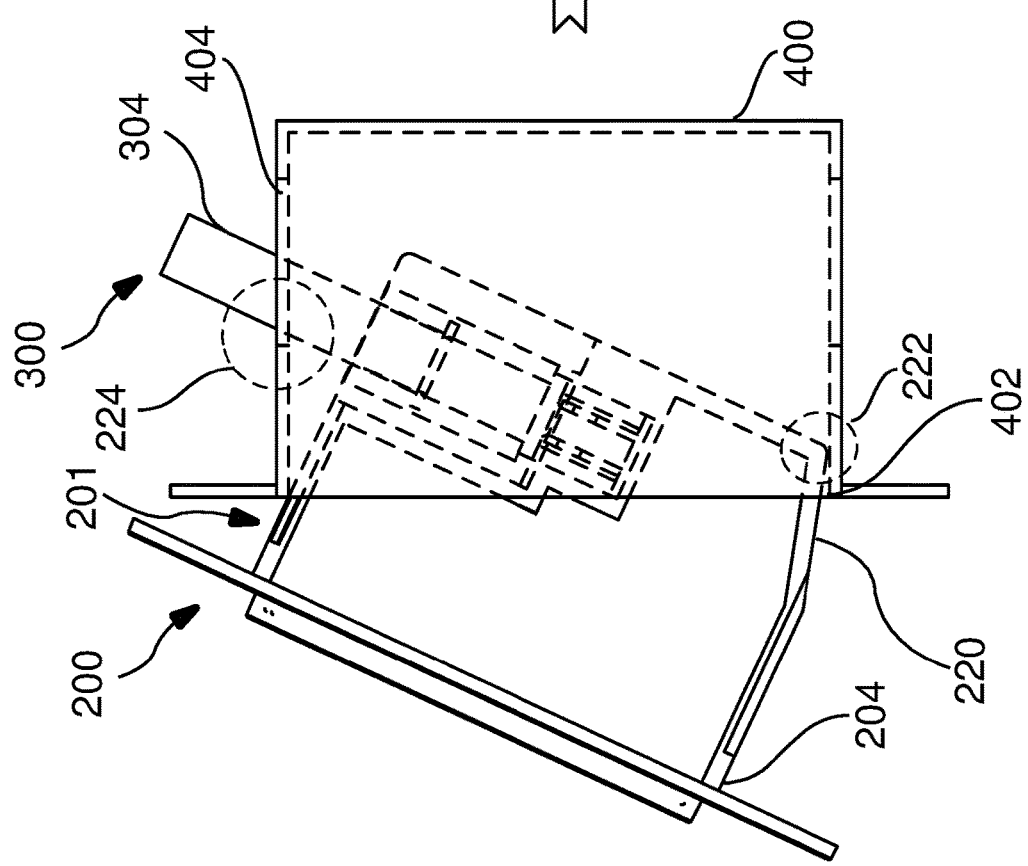
FIG. 4B
FIG. 4A

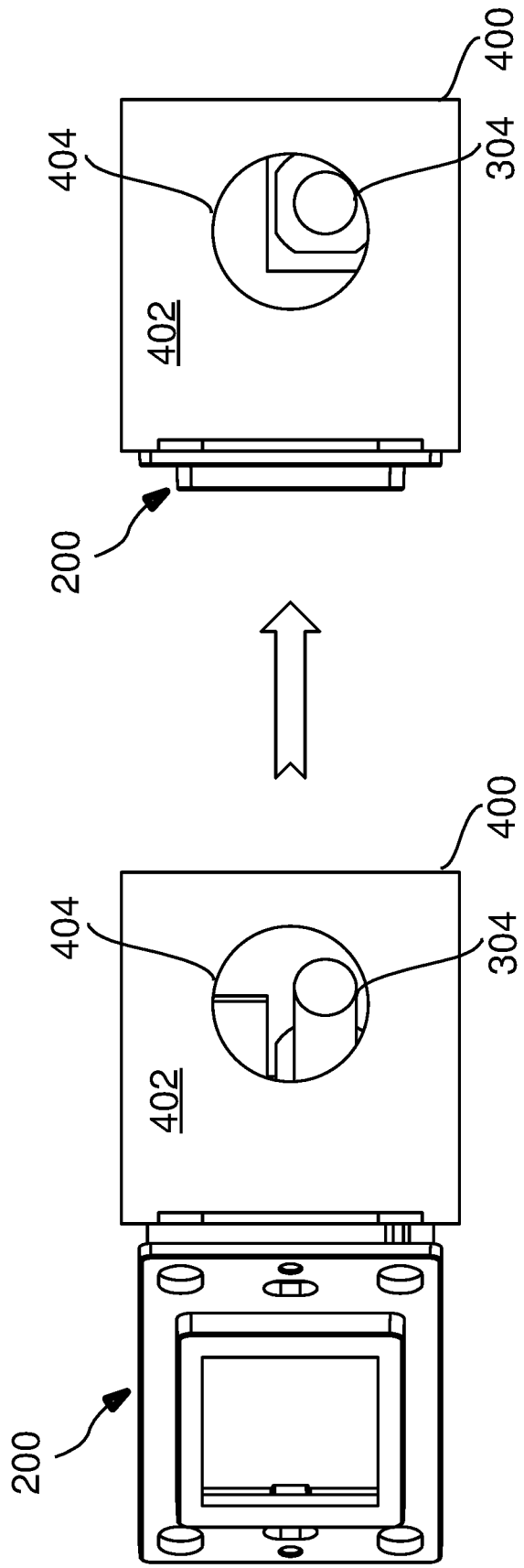

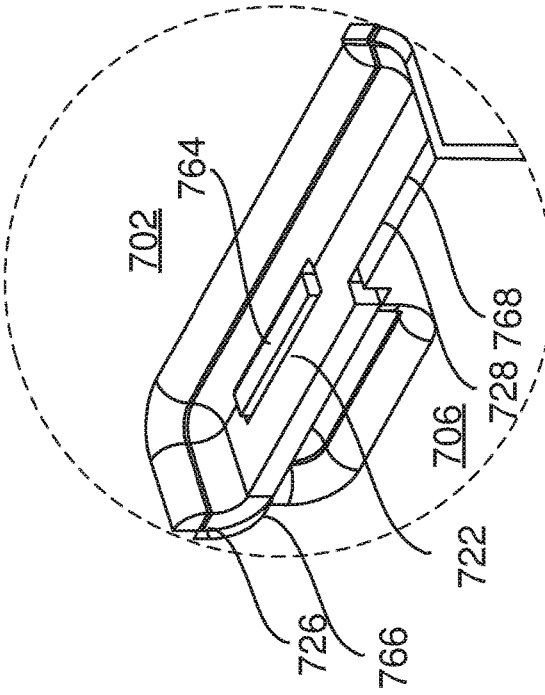
FIG. 10C
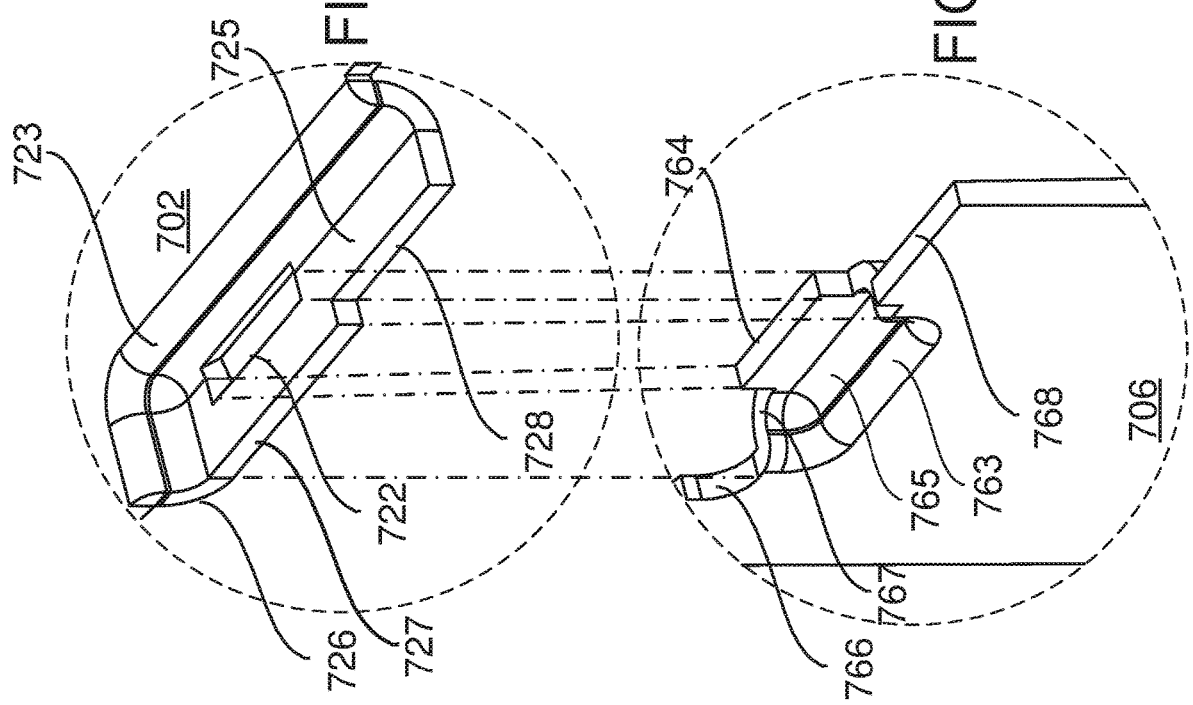
FIG. 10A
FIG. 10B

LOCK-IN FEATURES FOR ELECTRONICS BOXES

CROSS-REFERENCE TO RELATED APPLICATIONS

This application is a continuation of U.S. application Ser. No. 17/824,301, filed May 25, 2022, the disclosure of which is incorporated herein by reference.

BACKGROUND OF THE INVENTION

Technical Field

The present embodiments relate to electronics boxes and, more particularly, to improvements in the housings of electronics boxes.

Background Art

Electronics boxes are employed in many applications where a wall-mounted control device is desired. For example, a keypad, a lighting dimmer, a lighting switch, or an electronics switch may be encased within an electronics box. Various wires or cables may extend from the electronics box to provide power and/or data connections to the device encased in the electronics box.

To mount the electronics box in a wall, a wall box may be provided into which wires and or cables are fed. The wires may be spliced with wiring extending from the electronics box. Alternatively, or in combination with, one or more receptacles may be provided in the walls of the electronics box into which may be inserted a connector located at an end of a cable.

Typically, the electronics box is slightly smaller than the inner dimensions of the wall box. When only flexible wires connect to the electronics box, the electronics box may be inserted laterally into the opening in the wall box. However, when a less flexible cable is connected to the wall box, such as an ethernet cable or other cable, and protrudes from the electronics box, the electronics box must be inserted by angling a corner of the electronics box into the wall box opening to guide the cable through an opening in, for example, the top of the wall box. Because of the tight space available for inserting the electronics box, the cable may be bent when the electronics box is inserted or a "kink" may develop in the cable as the cable twists against the top opening. The bending or kinking of the cable poses the risk of damaging the cable.

It is therefore desirable to provide an electronics box that avoids bending or kinking of the cable when the electronics box is inserted into the wall box.

Additionally, the walls of an electronics box housing are typically held together using screws. The threaded part of the screw typically is passed through an opening in one wall of the electronics box housing and is then turned to pass into a corresponding threaded opening in an adjacent wall. The screw is then turned until the head of the screw presses against the first wall. The screw head, however, may rest against the surface of the wall and stick outward, potentially interfering with the insertion of the electronics box into a wall box opening. Therefore, a screw with a low-profile head, such as a pan head screw, may be employed and inserted into an opening having slanted walls so that the screw head sits flush with the wall surface. However, the incorporation of such slanted openings may increase the amount machining required, thereby increasing manufacturing costs. Further, assembly of the electronics box by turning screws is labor or machine intensive, further raising the cost of manufacturing.

It is therefore further desirable to provide an electronics box that can be assembled in a manner the minimizes the number of screws used.

SUMMARY OF THE INVENTION

It is to be understood that both the general and detailed descriptions that follow are exemplary and explanatory only and are not restrictive.

DISCLOSURE OF INVENTION

In accordance with an aspect, an electronics box for insertion into a wall box comprises (a) a housing having a plurality of surfaces, including (1) a top surface, (2) a bottom surface disposed opposite to the top surface, (3) a rear surface extending between the top surface and the bottom surface, (4) at least one side surface extending between the top surface and the bottom surface adjacent to the rear surface, (5) an intermediate surface disposed part way between the top surface and the bottom surface, and extending inward from the at least one side surface; and (6) a chamfer surface, disposed between an edge of the bottom surface and an edge of the rear surface, the chamfer surface being disposed at a particular angle with the respect to the bottom surface and having a particular length, (b) wherein (1) the particular angle and the particular length are selected such that the housing is able to be tilted and then inserted into the wall box with the chamfer surface clearing the wall box.

According to a further aspect, an electronics box for insertion into a wall box comprises (a) a housing having a plurality of surfaces, including (1) a top surface, (2) a bottom surface disposed opposite to the top surface, (3) a rear surface extending between the top surface and the bottom surface, (4) at least one side surface extending between the top surface and the bottom surface adjacent to the rear surface; (b) wherein (1) at least one of the plurality of surfaces includes a tab extending from an edge of the one of the plurality of surfaces, (2) at least another one of the plurality of surfaces includes an opening formed in the another of the plurality of surfaces and configured to receive the tab extending from edge of the one of the plurality of surfaces, and (3) the tab and the opening are dimensioned such that the tab of the one of the plurality of surfaces securely fits into the opening in the another of the plurality of surfaces such that the one of the plurality of surfaces and the another of the plurality of surfaces are secured together.

According to another aspect, an electronics box for insertion into a wall box comprises (a) a housing having a plurality of surfaces, including (1) a top surface, (2) a bottom surface disposed opposite to the top surface, (3) a rear surface extending between the top surface and the bottom surface, (4) a pair of side surfaces extending between the top surface and the bottom surface adjacent to the rear surface, (5) an intermediate surface disposed part way between the top surface and the bottom surface, and extending inward from the at least one side surface, and (6) a chamfer surface, disposed between an edge of the bottom surface and an edge of the rear surface, the chamfer surface being disposed at a particular angle with the respect to the bottom surface and having a particular length, (b) wherein (1) the particular angle and the particular length are selected such that the housing is able to be tilted and a corner formed by an intersection of the top surface and the rear surface then inserted into the wall box without bending an electronics cable attached at an end to an electronics connector engaged with the receptacle, the cable extending from the receptacle above the top surface of the housing and through an opening in a topmost surface of the wall box, the chamfer surface clearing the wall box, and (2) at least one of the plurality of surfaces includes a tab extending from an edge of the one of the plurality of surfaces, at least another one of the plurality of surfaces includes an opening formed in the another of the plurality of surfaces and configured to receive the tab extending from edge of the one of the plurality of surfaces, and the tab and the opening are dimensioned such that the tab securely fits into the opening such that the one of the plurality of surfaces the another of the plurality of surfaces are secured together.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

FIGS. 1A and 1B show side views of a prior art electronics box and its insertion into a wall box. FIGS. 1C and 1D show corresponding top views of the prior art electronics box and the wall box of FIGS. 1A and 1B.

Figure 2:
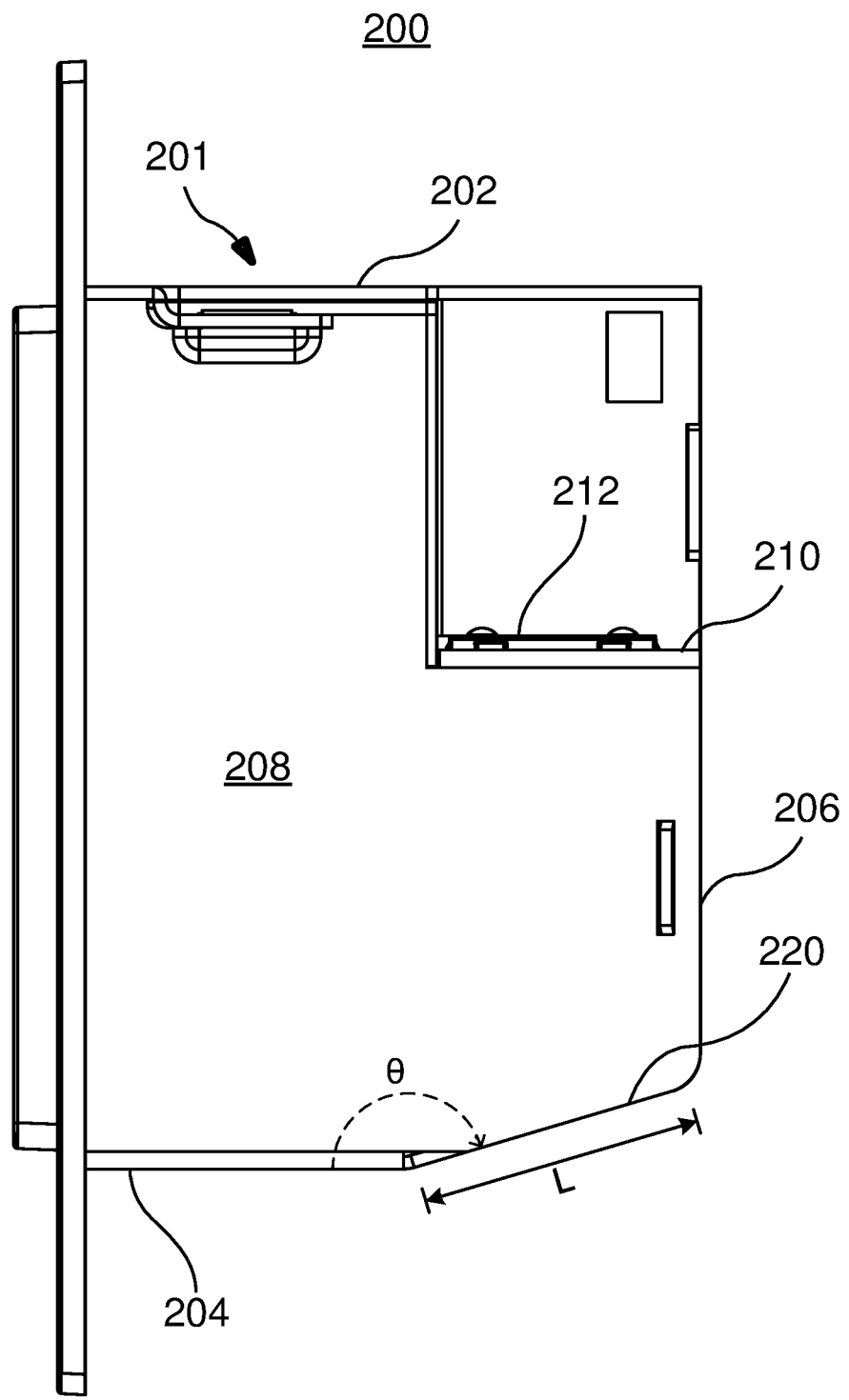

FIG. 2 shows a side view of an electronics box in accordance with an embodiment.

Figure 3:
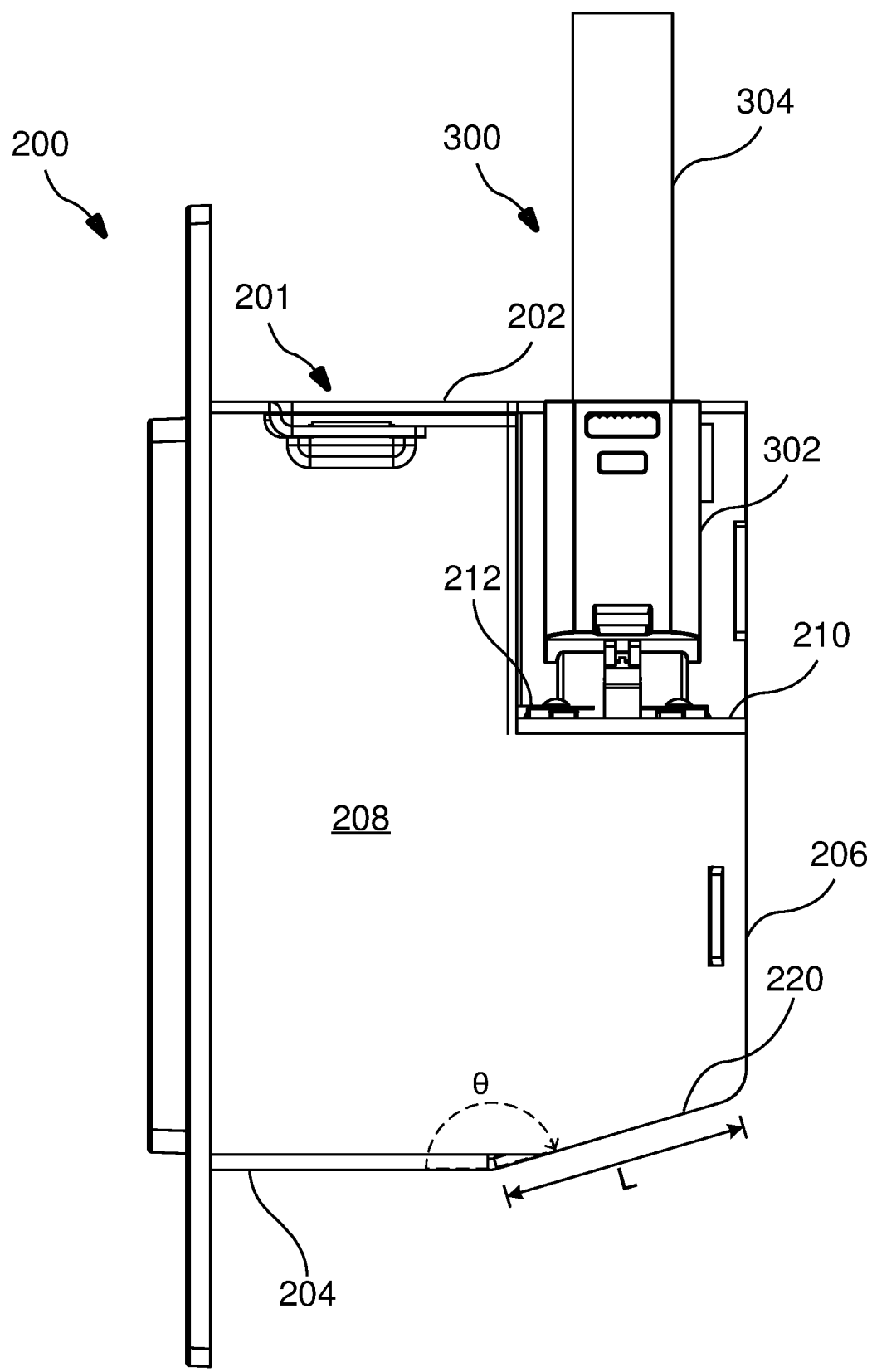

FIG. 3 shows a side view of the electronics box of FIG. 2 having an electronics cable inserted in the receptacle.

FIGS. 4A and 4B show side views of the electronics box of FIG. 3 and its insertion into a wall box in accordance with an embodiment.

FIGS. 5A and 5B show corresponding top views of the electronics box and wall box of FIGS. 4A and 4B.

Figure 6:
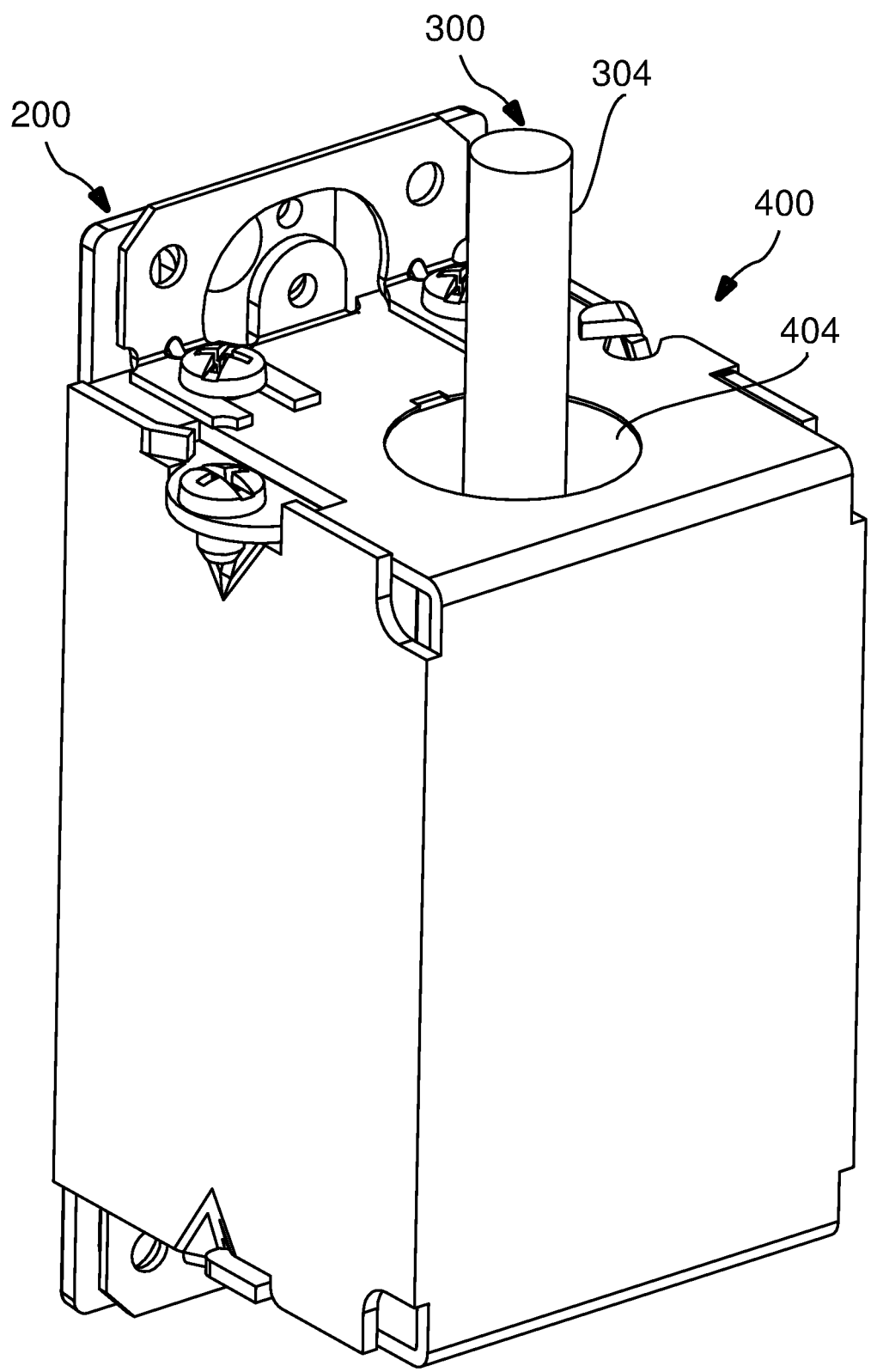

FIG. 6 shows a perspective view of the electronics box of FIG. 3 when disposed within an electronics box in accordance with an embodiment.

Figure 7:
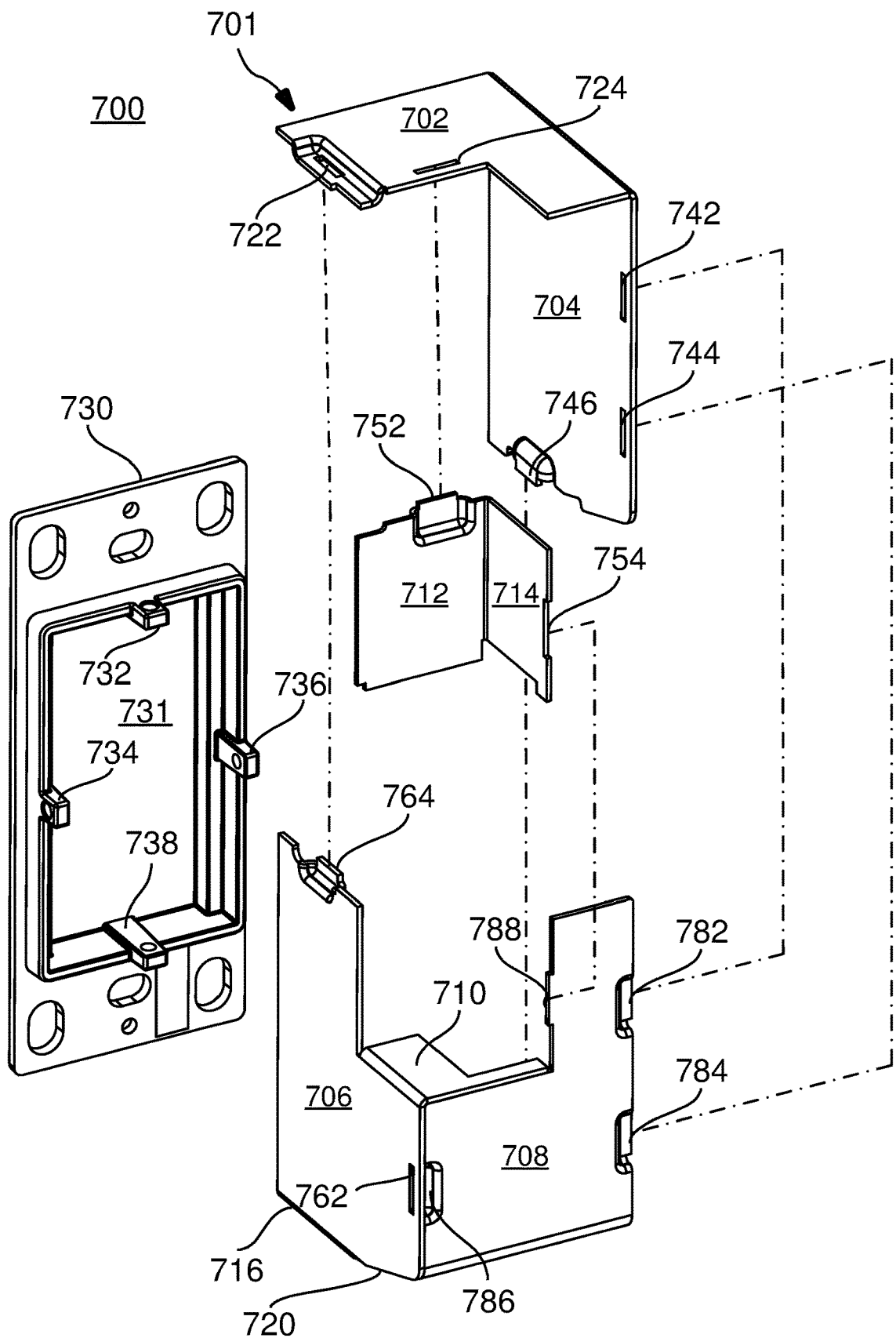

FIG. 7 shows an exploded perspective view of an electronics box with lock-in and alignment features in accordance with an embodiment.

FIGS. 8A-8E show the lock-in and alignment features of various sections of the electronics box of FIG. 7.

Figure 9:
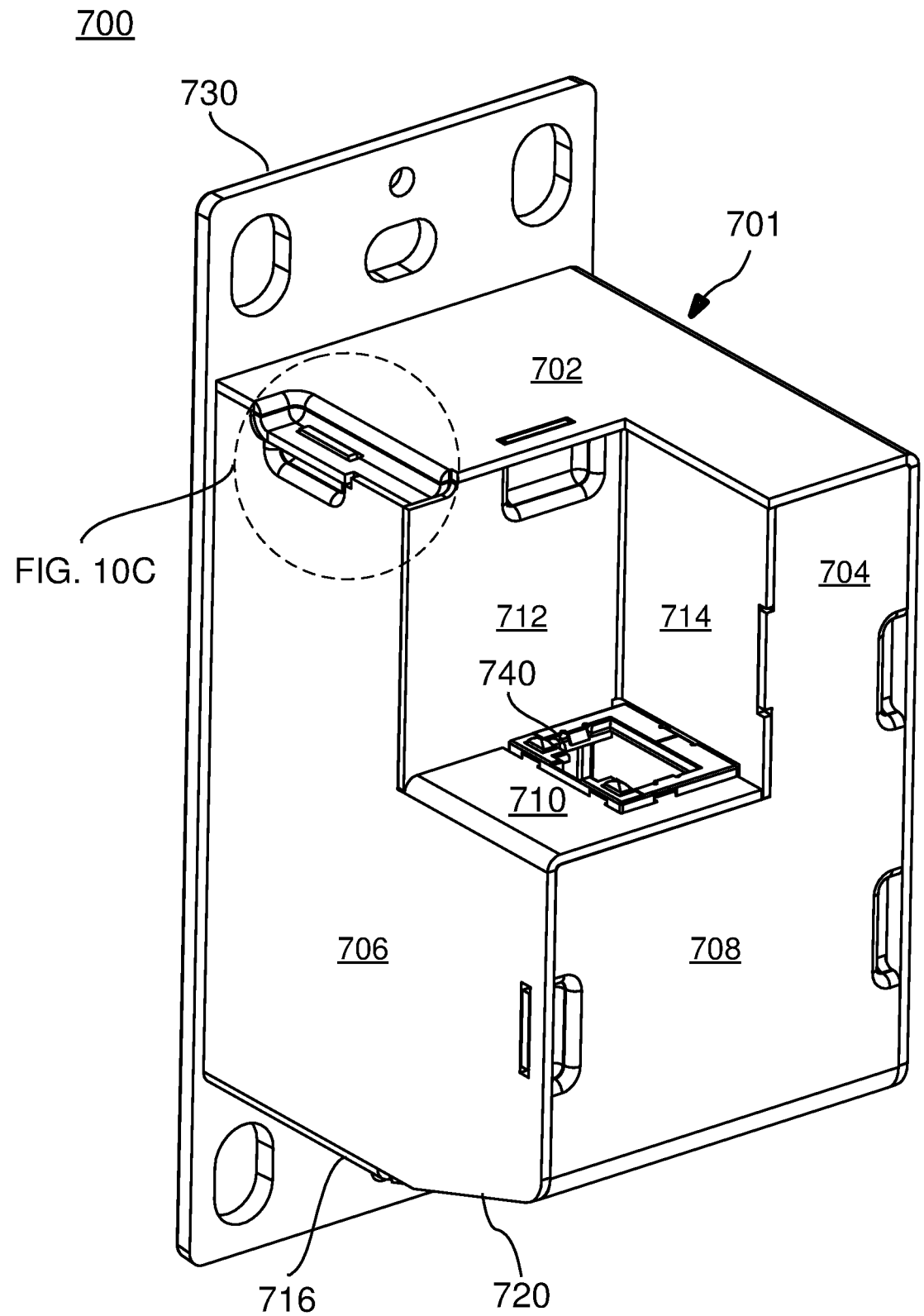

FIG. 9 shows a perspective view of the assembled electronics box of FIG. 7.

Figure 8A:
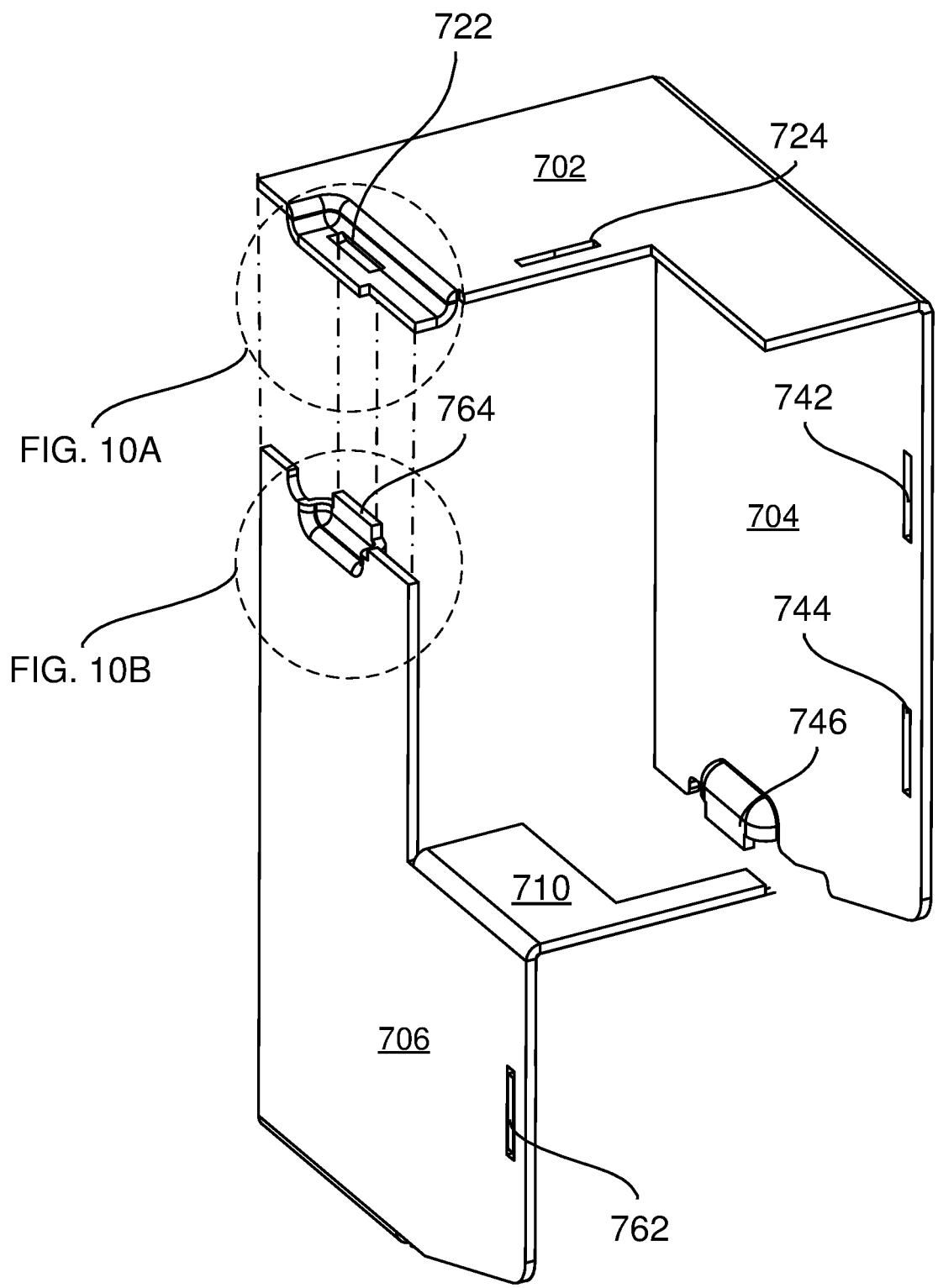

FIGS. 10A-10C show enlarged views of the lock-in and alignment features of FIGS. 8A and 9.

DETAILED DESCRIPTION OF THE INVENTION

The present embodiments provide an electronics box configured to be inserted into a wall box and its assembly.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.
100 Prior Art Electronics Box
101 Electronics Box Housing
102 Top Surface
104 Bottom Surface
106 Rear Surface
108 Side Surface
110 Intermediate Surface
112 Electronics Receptacle
114 Electronics Cable
116 Bend in Cable
120 Housing Corner
130 Wall Box
132 Wall Box Edge
134 Wall Box Top Opening
200 Electronics Box
201 Electronics Box Housing
202 Top Surface
204 Bottom Surface
206 Rear Surface
208 Side Surface
210 Intermediate Surface
212 Electronics Receptacle
220 Chamfer
224 Intersection
300 Electronics Cable
302 Electronics Connector
304 Cable Part
400 Wall Box
402 Wall Box Edge
404 Wall Box Top Opening
700 Electronics Box
701 Electronics Box Housing
702 Top Surface of Housing
704 Side Surface of Housing
706 Side Surface of Housing
708 Rear Surface of Housing
710 Intermediate Surface
712 Side Inner Surface
714 Rear Inner Surface
716 Bottom Surface of Housing
720 Chamfer
722 Slot
723 Curved Part
724 Slot
725 Recess
726 Curved Surface
727 Edge
728 Flat Surface
730 Cover Panel
731 Opening
732 Top Tab
734 Side Tab
736 Side Tab
738 Bottom Tab
742 Slot
744 Slot
746 Tab
752 Tab
754 Opening
762 Slot
763 Curved Part
764 Tab 765 Recess
766 Curved Surface
767 Edge
768 Flat Surface
782 Tab
784 Tab
786 Tab
788 Tab
L Length of Chamfer
θ Chamfer Angle

MODE(S) FOR CARRYING OUT THE INVENTION

The embodiments described herein are in the context of an electronics box, but is not limited thereto, except as may be set forth expressly in the appended claims.

Referring first to FIGS. 1A-1D, an example of a known electronics box 100 is shown. The known electronics box 100 exhibits some of the problems addressed in the present application.

The known electronics box 100 includes a housing 101 having a top surface 102 and an opposing bottom surface 104. A rear surface 106 is disposed between the top surface 102 and the bottom surface 104. Side surfaces 108 are disposed between the side edges of the top surface 102 and the bottom surface 104. One or more intermediate surfaces 110 are disposed part way between the top surface 102 and the bottom surface 104 and are generally parallel with the top and bottom surfaces. An electronics receptacle 112 is disposed in the intermediate surface 110 and is configured to receive a connector 112 which may be a data connector and/or a power connector. An electronics cable 114 extends from the connector past the top surface 102.

The housing 101 of the electronics box 100 typically has slightly smaller outer dimensions than those of an opening in a wall box 130 into which the housing is inserted. Because of a rigid or semi-rigid electronics cable 114 extends from the electronics box 100, the housing 101 can not be inserted laterally into the wall box 130. Rather, the housing 101 is first inserted at an angle so that an upper corner of the housing 101 enters first and directs the electronics cable 114 through an opening 134 in the wall box 130, as FIGS. 1A and 1C show. The feeding of the electronics cable 114 through the opening 134 forms a bend or kink 116 in the cable 114.

The housing 101 is then rotated so that a corner 120, at the intersection of the rear surface 106 and the bottom surface 104, can clear the edge 132 of the wall box 130. After the rotation of the housing 101, the bend or kink 116 remains present in the cable 114, as FIGS. 1B and 1D show, and stresses the cable 114, potentially damaging the cable.

FIG. 2 shows an electronics box 200 according to an embodiment. The electronics box 200 includes a housing 201 having a top surface 202, a bottom surface 204, a rear surface 206 disposed between the top surface 202 and the bottom surface 204 at the ends thereof, and side surfaces 208 disposed between the top surface 202 and the bottom surface 204 at their side edges. One or more intermediate surfaces 210 are disposed part way between the top surface 202 and the bottom surface 204 and are generally parallel with the top surface 202 and the bottom surface 204. An electronics receptacle 212 is disposed in the intermediate surface 210.

In accordance with the embodiment, a chamfer 220 is located between an edge of the bottom surface 204 and an edge of the rear surface 206 and is formed in place of the corner 120 shown in FIGS. 1A-1D. The chamfer 220 has a length L and is disposed at an angle θ with respect to the bottom surface 204.

As FIG. 3 shows, the electronics receptacle 212 is configured to receive a connector 302 of an electronics cable 300. The electronics cable 300 may be a data cable and/or a power cable. A cable part 304 extends from the connector 302 past the top surface 202 of the housing 201.

FIGS. 4A-4B and 5A-5B show an example of the insertion of the electronics box 200 into a wall box 400. Because the electronics cable 300 extends from the electronics box 200, the housing 201 cannot be inserted horizontally into the wall box 400. Instead, as FIGS. 4A and 5A show, the housing 201 is first inserted at an angle so that the cable part 304 passes through a top opening 404 in the wall box 400. Because of the presence of the chamfer 220, the cable part 304 passes through the top opening 404 without forming a bend or kink in the cable, thereby avoiding stress or damage to the cable 300. Preferably, the value of the length L of the chamfer 220 and the value of the angle θ between the bottom surface 204 and the chamfer 220 are chosen to ensure that the cable part 304 passes through the top opening 404 without forming such bend or kink in the cable.

Then, the housing 201 is turned so that the remainder of the housing 201 is located within the wall box 400, as FIGS. 4B and 5B show. Because of the presence of the chamfer 220, the corner 222 is able to clear the edge 404 of the wall box 400, and the cable part 304 is able to clear the top opening 404 of the wall box 400, without the cable part 304 bending at the intersection 224 of cable part 304 with the top opening 404. Preferably, the value of the length L of the chamfer 220 and the value of the angle θ between the bottom surface 204 and the chamfer 220 are further chosen to ensure such clearance during insertion of the housing 201.

FIG. 6 is a perspective view of the wall box 400 after insertion of the housing 201 of the electronics box 200 into the wall box 400. As FIGS. 5B and 6 show, the cable part 304 of the electronics cable 300 extends straight through the top opening 404 of the wall box 400 and without any bends or kinks being present in the cable part 304.

FIG. 7 is an exploded perspective view of an electronics box 700 according to an embodiment. The electronics box 700 includes a housing 701 having a top surface 702, an opposing bottom surface 716, and a rear surface 708 disposed between the ends of the top surface 702 and the bottom surface 716. A pair of side surfaces 704, 706 are disposed between the top surface 702 and the bottom surface 716 at their side edges. As described above, a chamfer 720 is located between an edge of the bottom surface 716 and an edge of the rear surface 708 and has a length L and an angle θ whose values are preferably selected in the manner described above.

One or more intermediate surfaces 710 are disposed part way between the top surface 702 and the bottom surface 716 and are generally parallel with the top surface 702 and the bottom surface 716. A rear inner surface 712 and a side inner surface 714 each extend between the top surface 702 and the intermediate surfaces 710.

The electronics box 700 further includes a cover panel 730 having an opening 731. Surrounding the opening 731 are four tabs 732, 734, 736, and 738 which serve to secure the cover panel 730 to the walls of the housing 701.

In accordance with the embodiment, some or all of the surfaces of the housing 700 are coupled together by inserting tab extending from one or more of the surfaces with slots located in one or more adjacent surfaces.

As an example, as FIG. 8A shows, the upper surface 702 includes a slot 722 that is configured to receive a tab 764 that extends from an edge of the side surface 706. FIG. 8A shows the alignment between the upper surface 702 and the side surface 706 and the manner in which the tab 764 is inserted into the slot 722.

Figure 8B:
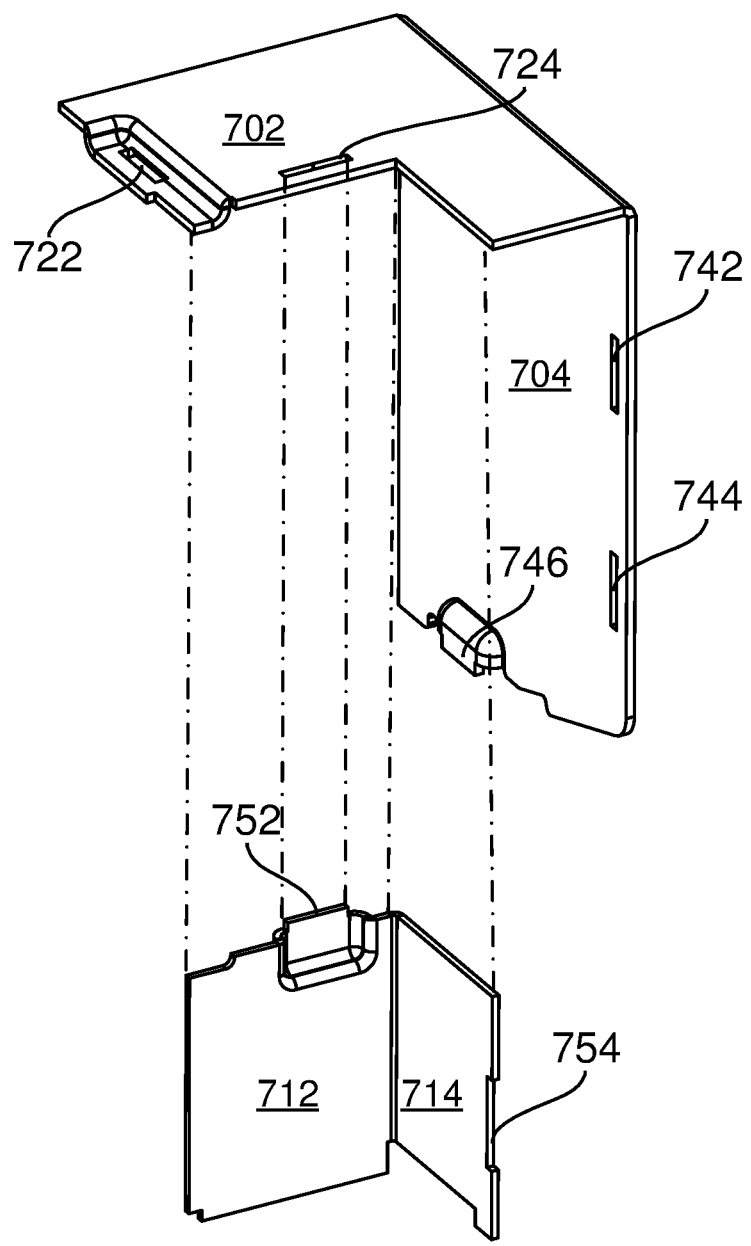

Turning back to FIG. 7, the upper surface 702 further includes a slot 724 that is configured to receive a tab 752 that extends from an edge of the rear inner surface 712. FIG. 8B is an enlarged view that shows the alignment between the upper surface 702 and the rear inner surface 712, the alignment between the upper surface 702 and the side inner surface 714, and the manner in which the tab 752 is inserted into the slot 722.

Figure 8C:
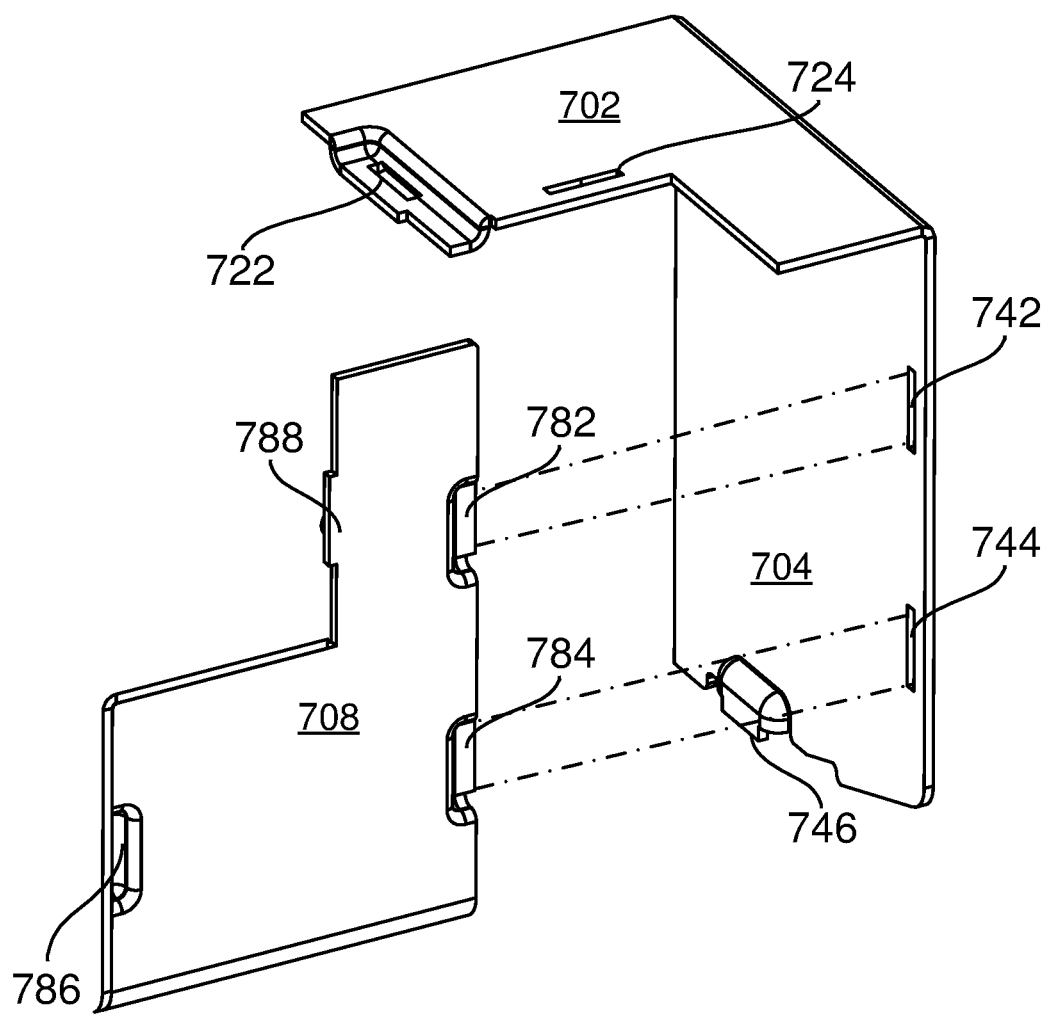

Referring again to FIG. 7, the side surface 704 includes a slot 742 that is configured to receive a tab 782 that extends from an edge of the rear surface 708. The side surface 704 also includes another slot 744 that is configured to receive another tab 784 that also extends from the edge of the rear surface 708. FIG. 8C is an enlarged view that shows the alignment between the side surface 704 and the rear surface 708 and the manner in which the tab 782 is inserted into the slot 742 as well as the manner in which the tab 784 is inserted into the slot 744.

Figure 8D:
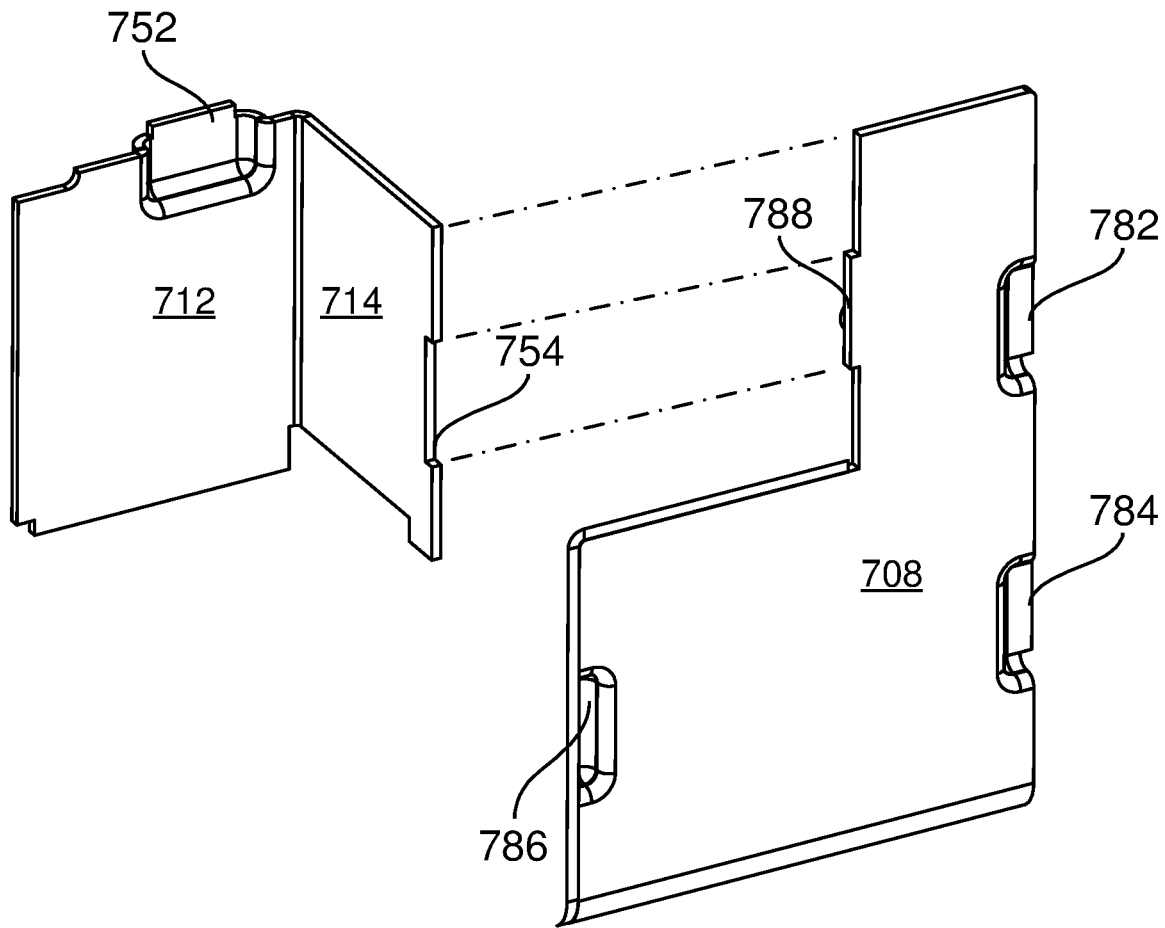

Again referring back to FIG. 7, the side inner surface 714 includes an opening 754 that is configured to receive a tab 788 that extends from an edge of the rear surface 708. FIG. 8D is an enlarged view that shows the alignment between the side inner surface 714 and the rear surface 708 and the manner in which the tab 788 is inserted into the opening 754.

Figure 8E:
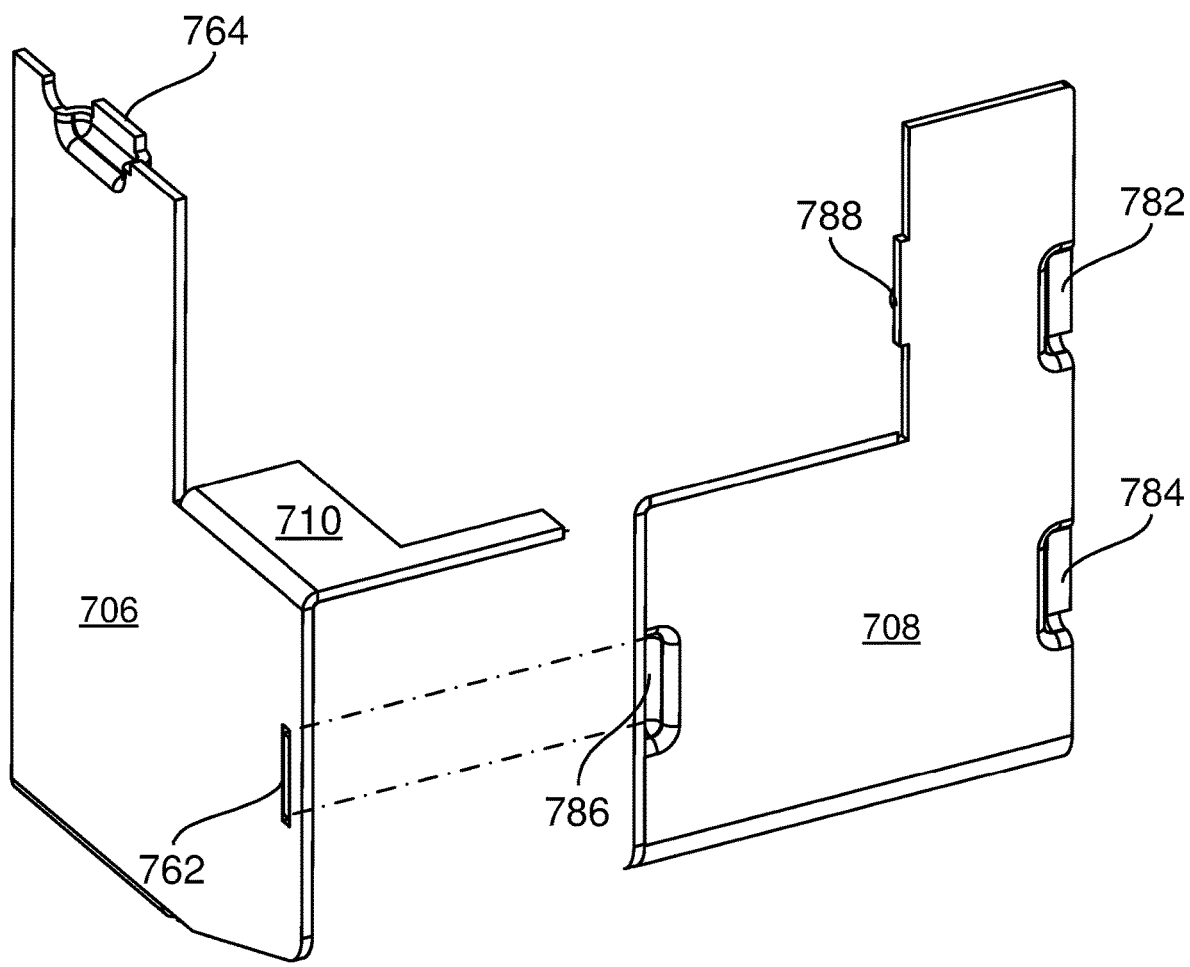

Turning back to FIG. 7, the side surface 706 further includes a slot 762 that is configured to receive a tab 786 that extends from an edge of the rear surface 708. FIG. 8E is an enlarged view that shows the alignment between the side surface 706 and the rear surface 708 and the manner in which the tab 786 is inserted into the slot 762.

FIG. 9 is a perspective view of the electronics box 700 in which the top surface 702, the side surface 704, the side surface 706, the rear surface 708, the intermediate surfaces 710, the rear inner surface 712, the side inner surface 714, and the bottom surface 716 are shown assembled together to form the housing 701. Specifically, the tabs shown in FIGS. 7 and 8A-8E have been inserted into their corresponding slots, also shown in FIGS. 7 and 8A-8E. Further, the housing 701 and the cover panel 730 are also shown assembled together to form the electronics box 700.

FIG. 10A is a further enlarged view of the slot 722 of the upper surface 702 shown in FIG. 8A together with its surrounding structure. A curved part 723 of the upper surface 702 curves away from the outside of the upper surface 702 and forms a recess 725 in the upper surface 702. The slot 722 is formed in the recess 725 in the upper surface 702. A curved surface 726, which is a part of an edge 727 of the upper surface 702, and a flat surface 728, which is another part of the edge 727 of the upper surface 702, are each located in proximity to the slot 722 and are configured to further secure the top surface 702 when coupled to the side surface 706.

FIG. 10B is a further enlarged view of the tab 764 of the side surface 706 shown in FIG. 8A together with its surrounding structure. A curved part 763 of the side surface 706 curves away from the outside of the side surface 706 and forms a recess 765 in the side surface 706. The tab 764 extends from an end of the recess 765 in the side surface 706. A curved surface 766, which is a part of an edge 767 of the side surface 706, and a flat surface 768, which is another part of the edge 767 of the side surface 706, are located in proximity to the tab 764 and are each configured to further secure the side surface 706 when coupled to the top surface 722.

FIG. 10C is a further enlarged view of the tab 764 inserted into the slot 722 as shown in FIG. 9. Specifically, the curved surface 726 of the top surface 722 abuts the curved surface 766 of the side surface 706, and the flat surface 728 of the top surface 722 abuts the flat surface 768 of the side surface 706. That is, the part 726 of the edge 727 of the upper surface 702 is brought in contact with the part 766 of the edge 767 of the side surface 706, and the another part 728 of the edge 727 of the upper surface 702 is brought in contact with the another part 768 of the edge 767 of the side surface 706. The contact between the two curved surfaces or parts 726, 766 and the contact between the two flat surfaces or parts 728, 768 each serve to further secure the top surface 702 to the side surface 706 when the tab 764 of the side surface 706 is inserted into the slot 722 of the top surface 702.

Similar structures are disposed adjacent to the other tabs and slots shown in FIGS. 7 and 8A-8E and also serve to further secure one surface to another when a tab of the one surface is inserted into a corresponding slot of the another surface.

INDUSTRIAL APPLICABILITY

To solve the aforementioned problems, the present embodiments are directed towards electronics boxes, and more specifically to improvements to electronics boxes. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described as being in particular combinations, each feature or element may be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that may be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the embodiments.

What is claimed is:

1. An electronics box for insertion into a wall box, the electronics box comprising:
   (a) a housing having a plurality of walls that define an inner volume, the plurality of walls including
      (1) a top wall,
      (2) a bottom wall disposed opposite to the top wall,
      (3) a rear wall extending between the top wall and the bottom wall,
      (4) at least one side wall extending between the top wall and the bottom wall adjacent to the rear wall;
   (b) wherein
      (1) a given one of the plurality of walls includes
         (A) an edge having at least a first part disposed along an outer surface of that wall, and
         (B) a tab that is disposed within the inner volume at a predetermined distance away from the outer surface of the wall and that extends along a direction parallel to the outer surface of the wall,
      (2) another one of the plurality of walls includes
         (A) an edge having at least a first part disposed along an outer surface of that wall, and
         (B) an opening formed in the wall that is completely surrounded by the wall and disposed a predetermined distance from the edge of the another one of the plurality of walls,
      (3) upon the first part of the edge of the given one of the plurality of walls being brought in contact with the at least first part of the edge of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls,
      (4) the given one of the plurality of walls includes a curved part that curves away from the outer surface of the wall into the inner volume and forms a recess in the given one of the plurality of walls, and
      (5) the edge of the given one of the plurality of walls includes
         (A) a second part of the edge that extends along the recess, and
         (B) a curved part disposed along the outer surface of the wall between an end of the first part and an end of the second part and that curves away from the first part such that second part is disposed lower than the first part.

2. An electronics box for insertion into a wall box, the electronics box comprising:
   (a) a housing having a plurality of walls that define an inner volume, the plurality of walls including
      (1) a top wall,
      (2) a bottom wall disposed opposite to the top wall,
      (3) a rear wall extending between the top wall and the bottom wall,
      (4) at least one side wall extending between the top wall and the bottom wall adjacent to the rear wall;
   (b) wherein
      (1) a given one of the plurality of walls includes
         (A) an edge having at least a first part disposed along an outer surface of that wall, and
         (B) a tab that is disposed within the inner volume at a predetermined distance away from the outer surface of the wall and that extends along a direction parallel to the outer surface of the wall,
      (2) another one of the plurality of walls includes
         (A) an edge having at least a first part disposed along an outer surface of that wall, and
         (B) an opening formed in the wall that is completely surrounded by the wall and disposed a predetermined distance from the edge of the another one of the plurality of walls,
      (3) upon the first part of the edge of the given one of the plurality of walls being brought in contact with the at least first part of the edge of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls,
      (4) the another one of the plurality of walls includes a curved part that curves away from the outer surface of the wall into the inner volume and forms a recess in the another one of the plurality of walls, and
      (5) the opening formed in the another one of the plurality of walls is formed in the recess of the another one of the plurality of walls.

3. An electronics box for insertion into a wall box, the electronics box comprising:
   (a) a housing having a plurality of walls that define an inner volume, the plurality of walls including
      (1) a top wall,
      (2) a bottom wall disposed opposite to the top wall,
      (3) a rear wall extending between the top wall and the bottom wall,
      (4) at least one side wall extending between the top wall and the bottom wall adjacent to the rear wall;
   (b) wherein
      (1) a given one of the plurality of walls includes
         (A) an edge having at least a first part disposed along an outer surface of that wall, and
         (B) a tab that is disposed within the inner volume at a predetermined distance away from the outer surface of the wall and that extends along a direction parallel to the outer surface of the wall,
      (2) another one of the plurality of walls includes
         (A) an edge having at least a first part disposed along an outer surface of that wall, and
         (B) an opening formed in the wall that is completely surrounded by the wall and disposed a predetermined distance from the edge of the another one of the plurality of walls, (3) upon the first part of the edge of the given one of the plurality of walls being brought in contact with the at least first part of the edge of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls, (4) a further one of the plurality of walls includes
  (A) an edge having at least a first part disposed along an outer surface of that wall, and
  (B) a tab that is disposed within the inner volume at a predefined distance away from the outer surface of the wall and that extends along a direction parallel to the outer surface of the wall, and (5) the given one of the plurality of walls includes
  (A) a further edge having at least a first part disposed along the outer surface of that wall, and
  (B) a further opening formed in the wall that is completely surrounded by the wall and disposed a predefined distance from the edge of the given one of the plurality of walls, and (6) upon the first part of the further edge of the given one of the plurality of walls being brought in contact with the at least first part of the edge of the further one of the plurality of walls, the tab of the further one of the plurality of wall is inserted into the further opening of the given one of the plurality of walls, the tab and the further opening being dimensioned such that the tab securely fits into the further opening and secures together the given one of the plurality of walls and the further one of the plurality of walls.

4. The electronics box according to claim 3, wherein
(a) the predefined distance away from the outer surface of the further one of the plurality of walls is a same distance as the predefined distance away from the edge of the given one of the plurality of walls.

5. An electronics box for insertion into a wall box, the electronics box comprising:
(a) a housing having a plurality of walls that define an inner volume, the plurality of walls including
  (1) a top wall,
  (2) a bottom wall disposed opposite to the top wall,
  (3) a rear wall extending between the top wall and the bottom wall,
  (4) at least one side wall extending between the top wall and the bottom wall adjacent to the rear wall;
(b) wherein
  (1) a given one of the plurality of walls includes
    (A) an edge having at least a first part disposed along an outer surface of that wall, and
    (B) a tab that is disposed within the inner volume at a predetermined distance away from the outer surface of the wall and that extends along a direction parallel to the outer surface of the wall,
  (2) another one of the plurality of walls includes
    (A) an edge having at least a first part disposed along an outer surface of that wall, and
    (B) an opening formed in the wall that is completely surrounded by the wall and disposed a predetermined distance from the edge of the another one of the plurality of walls,
  (3) upon the first part of the edge of the given one of the plurality of walls being brought in contact with the at least first part of the edge of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls,
  (4) a further one of the plurality of walls includes
    (A) an edge having at least a first part disposed along the outer surface of that wall, and
    (B) an opening formed in the wall that is completely surrounded by the wall and disposed a predefined distance from the edge of the further one of the plurality of walls, and
  (5) the another one of the plurality of walls includes
    (A) a further edge having at least a first part disposed along an outer surface of that wall, and
    (B) a tab that is disposed within the inner volume at a predefined distance away from the outer surface of the wall and that extends along a direction parallel to the outer surface of the wall, and
  (6) upon the first part of the edge of the further one of the plurality of walls being brought in contact with the at least first part of the further edge of the another one of the plurality of walls, the tab of the another one of the plurality of wall is inserted into the opening of the further one of the plurality of walls, the tab and the opening being dimensioned such that the tab securely fits into the opening and secures together the another one of the plurality of walls and the further one of the plurality of walls.

6. An electronics box for insertion into a wall box, the electronics box comprising:
(a) a housing having a plurality of walls that define an inner volume, the plurality of walls including
  (1) a top wall,
  (2) a bottom wall disposed opposite to the top wall,
  (3) a rear wall extending between the top wall and the bottom wall,
  (4) at least one side wall extending between the top wall and the bottom wall adjacent to the rear wall;
(b) wherein
  (1) a given one of the plurality of walls includes
    (A) an edge having at least a first part disposed along an outer surface of that wall, and
    (B) a tab that is disposed within the inner volume at a predetermined distance away from the outer surface of the wall and that extends along a direction parallel to the outer surface of the wall,
  (2) another one of the plurality of walls includes
    (A) an edge having at least a first part disposed along an outer surface of that wall, and
    (B) an opening formed in the wall that is completely surrounded by the wall and disposed a predetermined distance from the edge of the another one of the plurality of walls,
  (3) upon the first part of the edge of the given one of the plurality of walls being brought in contact with the at least first part of the edge of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls, (4) the at least one side wall includes
  (A) a pair of side walls extending between the top wall and the bottom wall and adjacent to the rear wall; and
(5) the plurality of walls includes
  (A) an intermediate wall disposed part way between the top wall and the bottom wall, and extending inward from one of the pair of side walls,
  (B) a further rear wall extending between the top wall and the intermediate wall, and
  (C) a further side wall extending between the top wall and the intermediate wall and adjacent to the further rear wall.

7. N electronics box for insertion into a wall box, the electronics box comprising:
(a) a housing having a plurality of walls that define an inner volume, the plurality of walls including
  (1) a top wall,
  (2) a bottom wall disposed opposite to the top wall,
  (3) a rear wall extending between the top wall and the bottom wall,
  (4) at least one side wall extending between the top wall and the bottom wall adjacent to the rear wall;
(b) wherein
  (1) a given one of the plurality of walls includes
    (A) an edge having at least a first part disposed along an outer surface of that wall,
    (B) a curved part that curves away from the outer surface of the wall into the inner volume and forms a recess in the given one of the plurality of walls, and
    (C) a tab that is disposed within the inner volume at a predetermined distance away from the outer surface of the wall and that extends from the recess along a direction parallel to the outer surface of the wall, and
  (2) another one of the plurality of walls includes
    (A) an edge having at least a first part disposed along an outer surface of that wall,
    (B) a curved part that curves away from the outer surface of the wall into the inner volume and forms a recess in the another one of the plurality of walls,
    (C) an opening formed in the recess that is completely surrounded by the recess and disposed a predetermined distance from the edge of the another one of the plurality of walls, and
  (3) upon the recess of the given one of the plurality of walls being brought in contact with the recess of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls.

8. The electronics box according to claim 7, wherein
(a) the edge of the given one of the plurality of walls includes
  (1) a second part of the edge that extends along the recess, and
  (2) a curved part disposed along the outer surface of the wall between an end of the first part and an end of the second part and that curves away from the first part such that second part is disposed lower than the first part.

9. The electronics box according to claim 8, wherein
(a) the edge of the another one of the plurality of walls includes
  (1) a second part of the edge that extends along the recess, and
  (2) a curved part disposed along the outer surface of the wall between an end of the first part and an end of the second part and that curves away from the first part such that second part is disposed lower than the first part.

10. The electronics box according to claim 9, wherein
(a) upon the tab of the given one of the plurality of walls being inserted into the opening of the another one of the plurality of walls, the curved part of the edge of the given one of the plurality of wall presses against the curved part of the edge of the another one of the plurality of walls and further secures together the given one of the plurality of walls and the another one of the plurality of walls.

11. The electronics box according to claim 7, wherein
(a) the edge of the given one of the plurality of walls includes
  (1) a second part that extends along the edge of the recess, and
  (2) the second part is disposed lower than the first part of the edge thereby forming a riser between a step formed by the first part and a step formed by the second part.

12. The electronics box according to claim 11, wherein
(a) the edge of the another one of the plurality of walls includes
  (1) a second part of the edge that extends along a part of the recess at a height lower than the first part, and
  (2) a third part of the edge that extends along another part of the recess at a same height as the second part and at a distance away from the second part thereby forming a riser between a step formed by the second part and a step formed by the third part.

13. The electronics box according to claim 12, wherein
(a) upon the tab of the given one of the plurality of walls being inserted into the opening of the another one of the plurality of walls, the riser between the step formed by the first part and the step formed by the second part of the edge of the given one of the plurality of walls presses against the riser between the step formed by the second part and the step formed by the third part of the edge of the another one of the plurality of walls and further secures together the given one of the plurality of walls and the another one of the plurality of walls.

14. The electronics box according to claim 13, wherein
(a) upon the tab of the given one of the plurality of walls being inserted into the opening of the another one of the plurality of walls, the riser in the edge of the given one of the plurality of walls abuts the riser in the edge of the another one of the plurality of walls and further secures together the given one of the plurality of walls and the another one of the plurality of walls.

15. N electronics box for insertion into a wall box, the electronics box comprising:
(a) a housing having a plurality of walls that define an inner volume, the plurality of walls including
  (1) a top wall,
  (2) a bottom wall disposed opposite to the top wall,
  (3) a rear wall extending between the top wall and the bottom wall,
  (4) a pair of side walls extending between the top wall and the bottom wall and adjacent to the rear wall, (5) an intermediate wall disposed part way between the top wall and the bottom wall, and extending inward from one of the pair of side walls,
(6) a further rear wall extending between the top wall and the intermediate wall, and
(7) a further side wall extending between the top wall and the intermediate wall and adjacent to the further rear wall;
(b) wherein
(1) a given one of the plurality of walls includes
(A) an edge having at least a first part disposed along an outer surface of that wall,
(B) a curved part that curves away from the outer surface of the wall into the inner volume and forms a recess in the given one of the plurality of walls, and
(C) a tab that is disposed within the inner volume at a predetermined distance away from the outer surface of the wall and that extends from the recess along a direction parallel to the outer surface of the wall, and
(2) another one of the plurality of walls includes
(A) an edge having at least a first part disposed along an outer surface of that wall,
(B) a curved part that curves away from the outer surface of the wall into the inner volume and forms a recess in the another one of the plurality of walls,
(C) an opening formed in the recess that is completely surrounded by the recess and disposed a predetermined distance from the edge of the another one of the plurality of walls,
(3) upon the recess of the given one of the plurality of walls being brought in contact with the recess of the another one of the plurality of walls, the tab of the given one of the plurality of wall is inserted into the opening of the another one of the plurality of walls, the tab and the opening being dimensioned such that the tab securely fits into the opening and secures together the given one of the plurality of walls and the another one of the plurality of walls,
(4) the edge of the given one of the plurality of walls includes
(A) a second part of the edge that extends along the recess,
(B) a curved part disposed along the outer surface of the wall between an end of the first part and an end of the second part and that curves away from the first part such that second part is disposed lower than the first part, and
(C) the second part is disposed lower than the first part of the edge thereby forming a riser between a step formed by the first part and a step formed by the second part,
(5) the edge of the another one of the plurality of walls includes
(A) a second part of the edge that extends along the recess, and
(B) a curved part disposed along the outer surface of the wall between an end of the first part and an end of the second part and that curves away from the first part such that second part is disposed lower than the first part,
(C) the second part of the edge extends along a part of the recess at a height lower than the first part, and
(D) a third part of the edge that extends along another part of the recess at a same height as the second part and at a distance away from the second part thereby forming a riser between a step formed by the second part and a step formed by the third part, and
(6) upon the tab of the given one of the plurality of walls being inserted into the opening of the another one of the plurality of walls,
(A) the curved part of the edge of the given one of the plurality of wall presses against the curved part of the edge of the another one of the plurality of walls and further secures together the given one of the plurality of walls and the another one of the plurality of walls,
(B) the riser between the step formed by the first part and the step formed by the second part of the edge of the given one of the plurality of walls presses against the riser between the step formed by the riser between the step formed by the second part and the step formed by the third part of the edge of the another one of the plurality of walls and further secures together the given one of the plurality of walls and the another one of the plurality of walls, and
(C) upon the tab of the given one of the plurality of walls being inserted into the opening of the another one of the plurality of walls, the riser in the edge of the given one of the plurality of walls abuts the riser in the edge of the another one of the plurality of walls and further secures together the given one of the plurality of walls and the another one of the plurality of walls.

* * * * *